(12) United States Patent
Cornic et al.

(10) Patent No.: US 8,540,523 B2
(45) Date of Patent: Sep. 24, 2013

(54) CONNECTION DEVICE FOR HIGH FREQUENCY SIGNALS BETWEEN A CONNECTOR AND A TRANSMISSION LINE

(75) Inventors: Pascal Cornic, Brest (FR); Jean-Philippe Coupez, Le Reflecq Kerhuon (FR); Jérémie Hemery, Tourc'h (FR); Julien Boucher, Commana (FR)

(73) Assignees: Thales, Neuilly-sur-Seine (FR); Groupe des Telecommunications/Ecole Nationale Superieure des Telecoms Bretagne, Brest (FR)

( * ) Notice: Subject to any disclaimer, the term of this patent is extended or adjusted under 35 U.S.C. 154(b) by 250 days.

(21) Appl. No.: 12/879,951

(22) Filed: Sep. 10, 2010

(65) Prior Publication Data
US 2011/0217853 A1    Sep. 8, 2011

(30) Foreign Application Priority Data
Sep. 11, 2009 (FR) ...................................... 09 04347

(51) Int. Cl.
*H01R 12/00* (2006.01)
(52) U.S. Cl.
USPC ........................................... 439/63; 333/260
(58) Field of Classification Search
USPC ...................................................... 439/63, 55
See application file for complete search history.

(56) References Cited

U.S. PATENT DOCUMENTS

| 4,837,529 | A | | 6/1989 | Gawronski et al. |
| 5,525,075 | A | * | 6/1996 | Michisita et al. ............. 439/581 |
| 6,700,464 | B2 | * | 3/2004 | Ling et al. ..................... 333/260 |
| 6,863,548 | B1 | * | 3/2005 | Coccioli et al. ............... 439/101 |
| 6,976,855 | B2 | * | 12/2005 | Kennedy et al. ................ 439/83 |
| 6,992,544 | B2 | * | 1/2006 | Barnes et al. .................. 333/33 |
| 2005/0146390 | A1 | | 7/2005 | Baek |
| 2006/0208835 | A1 | * | 9/2006 | Lee ............................... 333/260 |
| 2009/0056999 | A1 | | 3/2009 | Kashiwakura |

FOREIGN PATENT DOCUMENTS
WO    2008024411 A2    2/2008

OTHER PUBLICATIONS

Liu Q H et al., "A Coaxial-to-Microstrip Transition for Multilayer Substrates", IEEE Transactions on Microwave Theory and Techniques, IEEE Service Center, Feb. 1, 2004, pp. 584-588, vol. 52, No. 2, Piscataway, NJ, XP011107716.

* cited by examiner

*Primary Examiner* — Michael Zarroli
(74) *Attorney, Agent, or Firm* — Baker & Hostetler LLP

(57) ABSTRACT

A connection device for high frequency signals is disclosed. The connection device includes a printed circuit having an external face and a transmission line printed on the external face, and a coaxial connector surface mounted on the external face of the printed circuit. The transmission line is connected to the connector by means of a bump contact belonging to the transmission line. A central core of the connector is connected to the bump contact. The printed circuit has at least one internal ground plane disposed parallel to the external face and contributing to the matching of the transmission line. The internal ground plane defines a perforation therethrough that faces the bump contact.

13 Claims, 7 Drawing Sheets

CONNECTION DEVICE FOR HIGH FREQUENCY SIGNALS BETWEEN A CONNECTOR AND A TRANSMISSION LINE

CROSS-REFERENCE TO RELATED APPLICATION

This application claims priority to foreign French patent application No. FR 09 04347, filed on Sep. 11, 2009, the disclosure of which is incorporated by reference in its entirety.

FIELD OF THE INVENTION

The invention relates to a connection device for high frequency signals comprising a printed circuit on one external face of which is printed a transmission line and a coaxial connector surface mounted on the printed circuit on the external face. The invention is of particular use for the transmission of radiofrequency signals in the X band, in particular for frequencies from 9 to 10 GHz. The invention can be applied to other frequency bands.

BACKGROUND OF THE INVENTION

In order to convey high frequency signals, a so-called micro strip technology implemented on printed circuit is, for example, used. Printed conductive tracts are produced on faces of the printed circuit. These faces may be external or internal and may be separated by one or more conductive planes or ground planes. The micro strip lines have particular dimensions such that, once associated with the conductive planes, they form impedance-matched lines. This matching makes it possible to provide a certain transparency of the line with regard to the signal conveyed. In other words, the aim is to minimize the electrical power losses of the signal along the line.

To convey the high frequency signals outside the printed circuit, coaxial connectors for connecting the micro strip lines to coaxial cables, whose impedances are also matched, are, for example, used. There are connectors intended for surface-mounting. This type of mounting does not require any metallized hole for a contact of the connector to be inserted into. More specifically, these connectors are connected to the printed circuit by bonding flat areas of the connector to external lands of the printed circuit. The connection may be made by means of a conductive glue or a solder paste interposed between the flat areas and the corresponding lands. The printed circuit on which the components are placed, such as the connectors, is immersed in a tank in which a hot fluid, generally in vapour phase, is used to solder the components.

FIG. 1 illustrates one embodiment of a printed circuit 10 intended to receive a connector 11 on one of its external faces 12. This embodiment was implemented by the applicant without being disclosed. On this face, a transmission line 13, produced in the form of a micro strip line, comprises a rectilinear part 14 terminated by a circular bump contact 15, the diameter of which is greater than the width of the rectilinear part 14. The width of the rectilinear part 14 is defined so that the transmission line has a determined impedance, for example 50 ohms. This impedance depends on the composition and the dimensions of the printed circuit 10. For example, the printed circuit comprises an insulating substrate of relative permittivity $\epsilon_r$ equal to 3.38, the substrate separating the external face 12 from an internal ground plane situated facing the transmission line 13. The internal ground plane is not visible in FIG. 1. To obtain an impedance of 50 ohms, a width for the rectilinear part 14 of 450 μm and a thickness of the substrate of 203 μm are, for example, selected. As for the diameter of the bump contact 15, this is imposed by the diameter of the flat area of the core of the connector 11. In FIG. 1, the core cannot be seen. It is concealed by the body 16 of the connector 11. The body 16 is connected by flat areas 17 to a ground plane 18 produced on the external face 12 and surrounding the transmission line 13. In the example shown, the diameter of the bump contact 15 is 1.7 mm. Metallized holes or vias 19 are used to connect the ground plane 18 to the internal ground plane. The ground plane 18 is positioned at a distance from the transmission line 13 so that its interaction with the transmission line 13 does not modify, or modifies only negligibly, the impedance of the transmission line 13 while providing shielding for the latter. The edges of the ground plane 18 are, for example, situated at a distance d of 500 μm from the transmission line 13. The ground plane 18 notably allows for easier grounding for the surface-mounted components, in particular for the connector 11. The ground plane 18 also provides strong electrical insulation between the various patterns printed on the external face 12.

FIGS. 1a and 1b represent enlarged views of the transmission line 13 in its plane. FIG. 1a represents a portion of the rectilinear part 14. All along this part, the distance d is constant. FIG. 1b represents the transmission line 13 at its bump contact 15. The distance d, defined for the rectilinear part 14, is maintained around the bump contact 15.

Connecting the connector 11 with a multilayer structure, as illustrated in FIG. 1, produces spurious electrical effects, which in particular break the transparency of the connector with regard to the signal conveyed. This transparency is above all degraded at high frequency. These effects, notably linked to the intrinsic capacitive nature of the bump contact 15, then result in mismatching and greater or lesser insertion losses on the signal.

FIG. 2 represents the matching level S11 of the example represented in FIG. 1 expressed in dB according to the frequency of the signal conveyed by the transmission line 13 and the connector 11. The matching level illustrates the reflected electrical power. Still for this example, FIG. 3 represents the insertion level S21 or insertion losses expressed in dB according to the frequency of the signal. The insertion level illustrates the electrical power losses in transmission at the connection between the transmission line 13 and the connector 11.

It is found, in this case, that this connection exhibits a matching level of −6 dB for a useful working frequency of 9.3 GHz, and insertion losses of 1.5 dB for this same frequency. Given these results, the connection is far from optimal.

To improve the transparency of this connection, the applicant has proposed correcting this mismatching. An exemplary embodiment of this correction is represented in FIG. 4. The transmission line 13 comprises, in the vicinity of the bump contact 15, an inductive line section 20 and a capacitive line section 21 that make it possible to produce a low-pass type filtering element cooperating with the impedance added by the transition between the connector 11 and the bump contact 15. The inductive line section 20 is formed by a micro strip line, the width of which is less than that of the rectilinear part 14. The capacitive line section 21 is formed by a square-shaped bump contact, the side dimension of which is greater than the width of the rectilinear part 14. The inductive line section 20 is positioned between the bump contact 15 and the capacitive line section 21. In a first approach, the various electrical elements of the transition, associated with impedance values at a given frequency, form a π-form low-pass filter cell comprising an inductance, the inductive line section 20, positioned between two capacitances, the capacitive line section 21 and the bump contact 15. The dimension of the bump contact 15 is imposed by the connector 11 and the dimensions of the impedances 20 and 21 are matched to obtain the best transparency for the transition at the frequency concerned according to the characteristics of the printed circuit 10, thickness and permittivity of the substrate.

FIG. 5 represents the matching level S11 of the example represented in FIG. 4 expressed in dB according to the frequency of the signal conveyed by the transmission line 13 and the connector 11. Still for this example, FIG. 6 represents the insertion losses expressed in dB according to the frequency of the signal. It is found, in this case, that this transition exhibits a matching level of approximately −18 dB for a useful working frequency of 9.3 GHz, and insertion losses of 0.27 dB for this same frequency. It is found that the correction made significantly improves the transparency of the transition. However, the results obtained exhibit a relatively narrowband nature around the working frequency. It is therefore necessary to modify the design of the printed circuit for any change of working frequency, however small. Furthermore, the quality of the correction obtained in this way is highly sensitive to the production tolerances of the printed circuit and the positioning tolerances of the connector on the printed circuit. In other words, there is a risk of obtaining significant random effects on the quality of the correction between two printed circuits produced according to the same design.

SUMMARY OF THE INVENTION

The invention improves the transparency of a transition between a printed circuit and a coaxial connector for use at high frequency. The aim of the invention is to obtain the desired transparency for a significant band width about a given working frequency.

To this end, invention is, in one embodiment, a connection device for high frequency signals, comprising a printed circuit on one external face of which is printed a transmission line and a coaxial connector surface mounted on the printed circuit on the external face, the transmission line being connected to the connector by means of a bump contact belonging to the transmission line to which is attached a central core of the connector, the printed circuit comprising at least one internal ground plane parallel to the external face and contributing to the matching of the transmission line, wherein the ground plane is perforated by means of a resist facing the bump contact.

The surface-mounting of the core of the connector is done without metallized hole and therefore without connection to internal layers of the printed circuit.

By perforating the ground plane, the impedance added by the bump contact can be reduced. The transparency of the transition between the transmission line and the connector is thus enhanced.

BRIEF DESCRIPTION OF THE DRAWINGS

The invention will be better understood, and other advantages will become apparent, from reading the detailed description of an embodiment given by way of example, the description being illustrated by the appended drawing in which:

In the interests of clarity, the same elements are given the same identifiers in the various figures. FIGS. 1 to 6 have already been described to introduce the invention.

DETAILED DESCRIPTION

Figure 7:
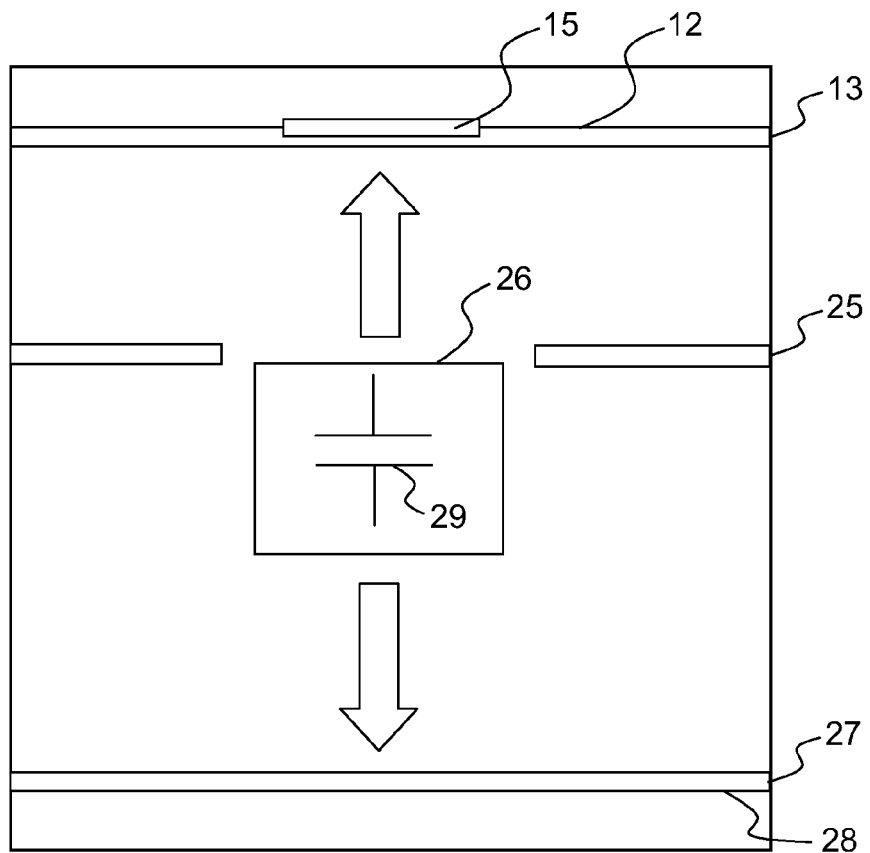
FIG. 7 represents, in cross section, an exemplary embodiment of a printed circuit according to the invention.

FIG. 7 represents, in cross section, the printed circuit 10 containing, on its external face 12, the transmission line 13 and its bump contact 15. The internal ground plane here is given the identifier 25 and contributes to the matching of the transmission line 13. According to the invention, the internal ground plane 25 comprises a resist 26 situated facing the bump contact 15. In the absence of resist, the presence of the bump contact 15 facing the ground plane 25 creates a mismatching of the transmission line 13. The resist makes it possible to reduce this mismatching.

Advantageously, the printed circuit 10 comprises a second ground plane 27, parallel to the internal ground plane 25. The internal ground plane 25 is situated between the transmission line 13 and the second ground plane 27 which may be positioned on a second external face 28 of the printed circuit 10. The second ground plane 27 provides shielding for the matched assembly formed by the transmission line 13 and the internal ground plane 25. The second ground plane 27 is continuous facing the bump contact 15. In other words, the second ground plane 27 is not perforated facing the bump contact 15. The second ground plane 27 therefore forms with the bump contact 15 a mainly capacitive impedance. This impedance, symbolized by a capacitor 29, is less than that obtained in the absence of resist 26 between the ground plane 25 and the bump contact 15. The presence of the ground plane 27 makes it possible to electromagnetically close the printed circuit 10 facing the bump contact 15 and therefore control the impedance of the connection of the connector 11 and of the transmission line 13 by means of the capacitor 29.

Figure 8:
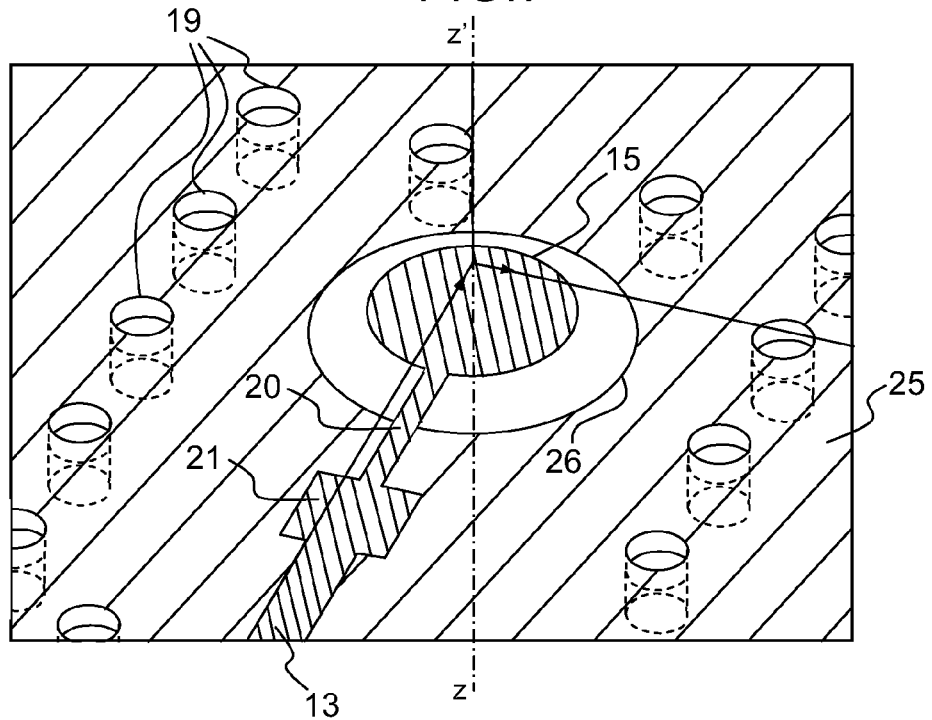
FIG. 8 represents, in perspective, the printed circuit of FIG. 7, complemented by an impedance correction.

FIG. 8 represents, in perspective, the transmission line 13 and the internal ground plane 25. The bump contact 15 and the resist 26 are both circular and centred on one and the same axis zz' perpendicular to the various planes of the printed circuit 10. To avoid overloading the figure, the ground plane 18 is not represented. Only the vias 19 connecting the ground plane 18 to the internal ground plane 25 appear in FIG. 8. The vias 19 may also be connected to the ground plane 27 to impose one and the same ground reference locally at each via 19.

Advantageously, the diameter of the resist 26 is greater than that of the bump contact 15 so as to limit the impedance generated between the bump contact 15 and the internal ground plane 25. For example, for a bump contact 15 of 1.7 mm diameter, a resist 26 of 2.7 mm diameter is produced. Thus, in the impedance of the transition between the transmission line 13 and the core of the connector 11, the interaction of the bump contact 15 and of the ground plane 27 is predominant relative to the interaction of the bump contact 15 and of the internal ground plane 25. The diameter of the resist 26 should not, however, be too great to maintain its interaction with the transmission line in its rectilinear part 14.

Figure 1:
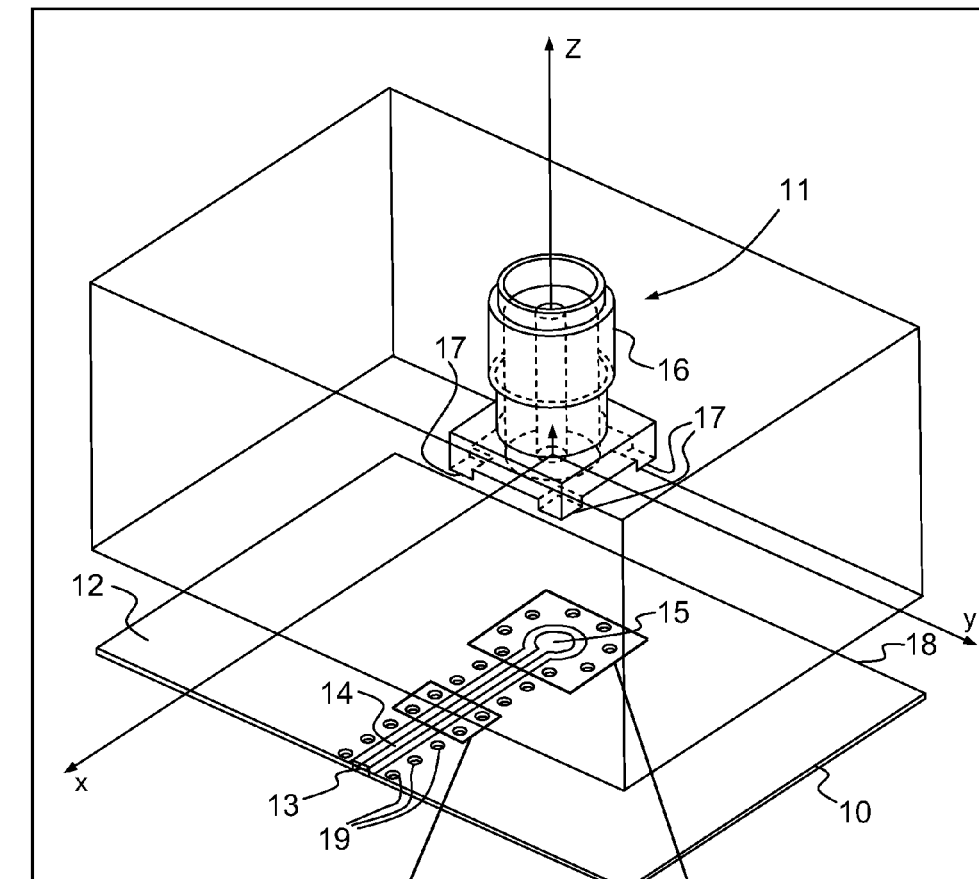
FIG. 1 represents an exemplary embodiment of a printed circuit intended to receive a connector on one of its external faces.
Figure 1A:
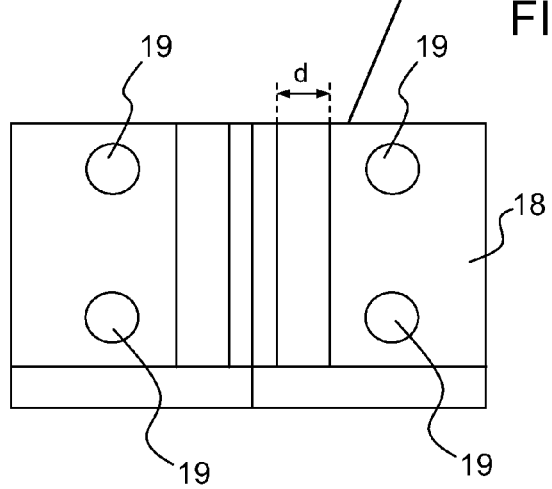
Figure 1B:
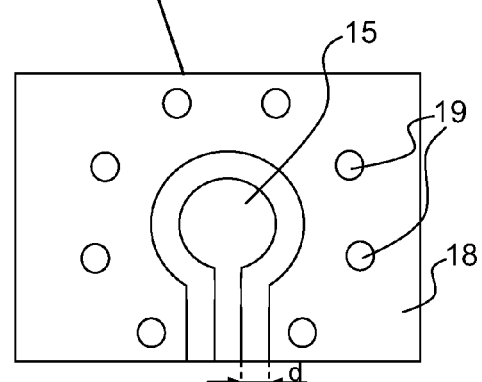
Figure 2:
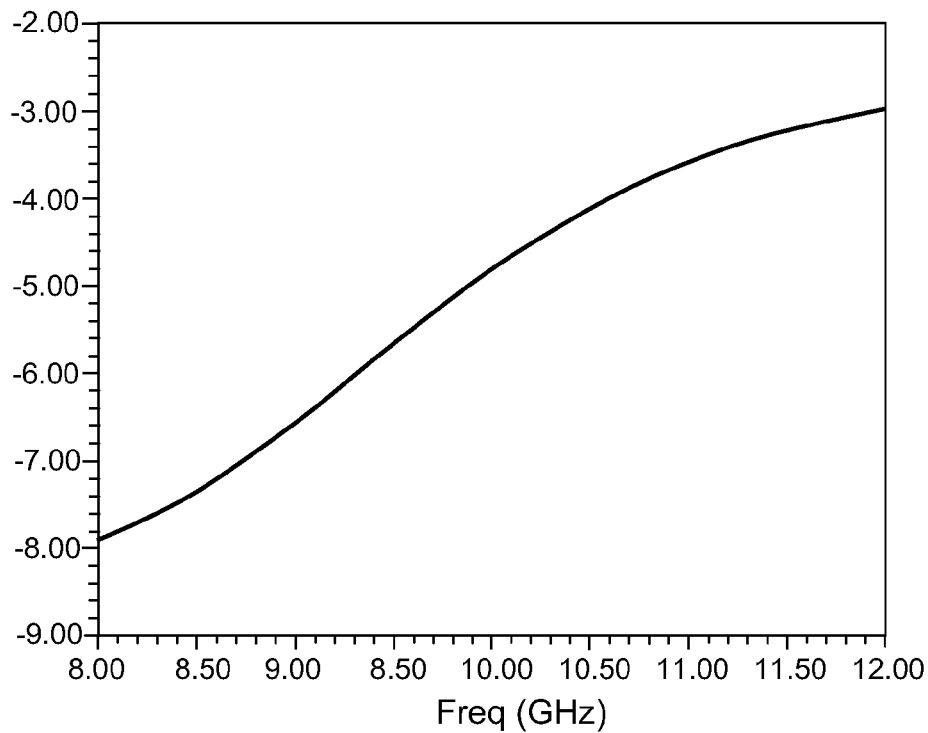
FIG. 2 represents the matching level S11 of the example represented in FIG. 1.
Figure 3:
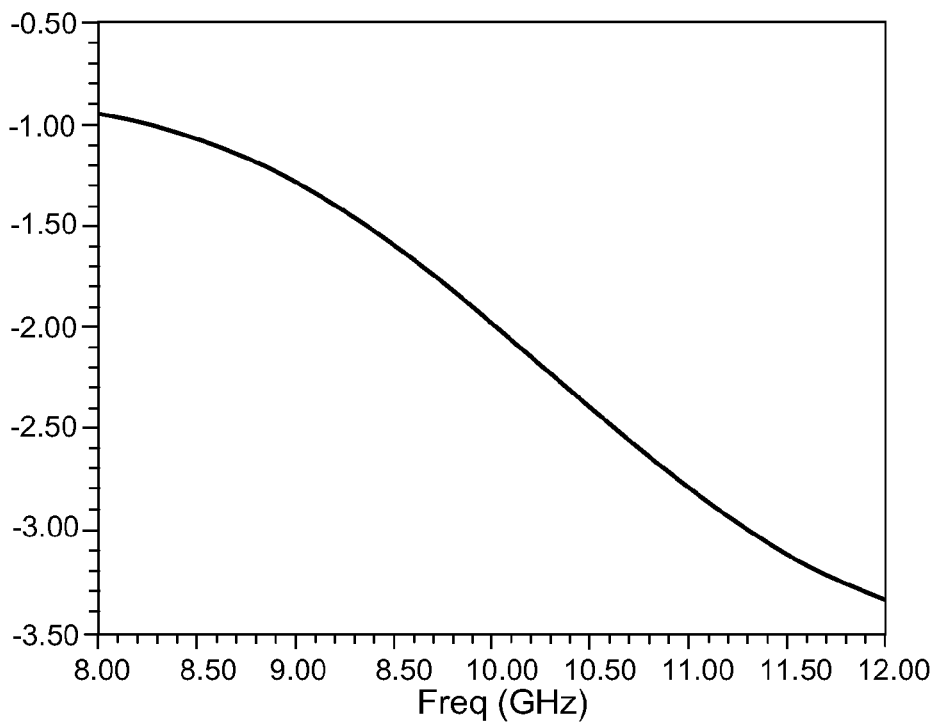
FIG. 3 represents the insertion level S21 or insertion losses of the example represented in FIG. 1.
Figure 4:
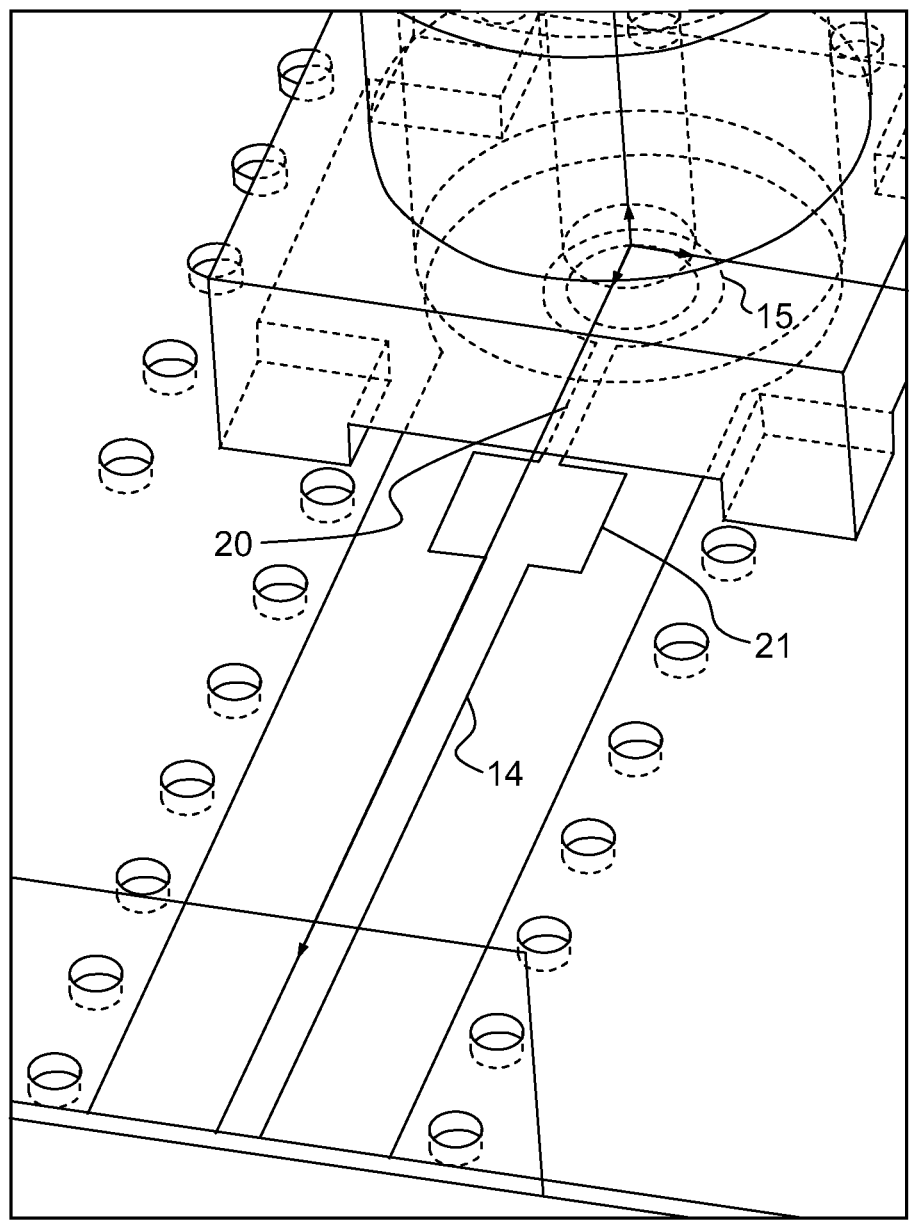
FIG. 4 represents an example of correction applied to the printed circuit of FIG. 1.
Figure 5:
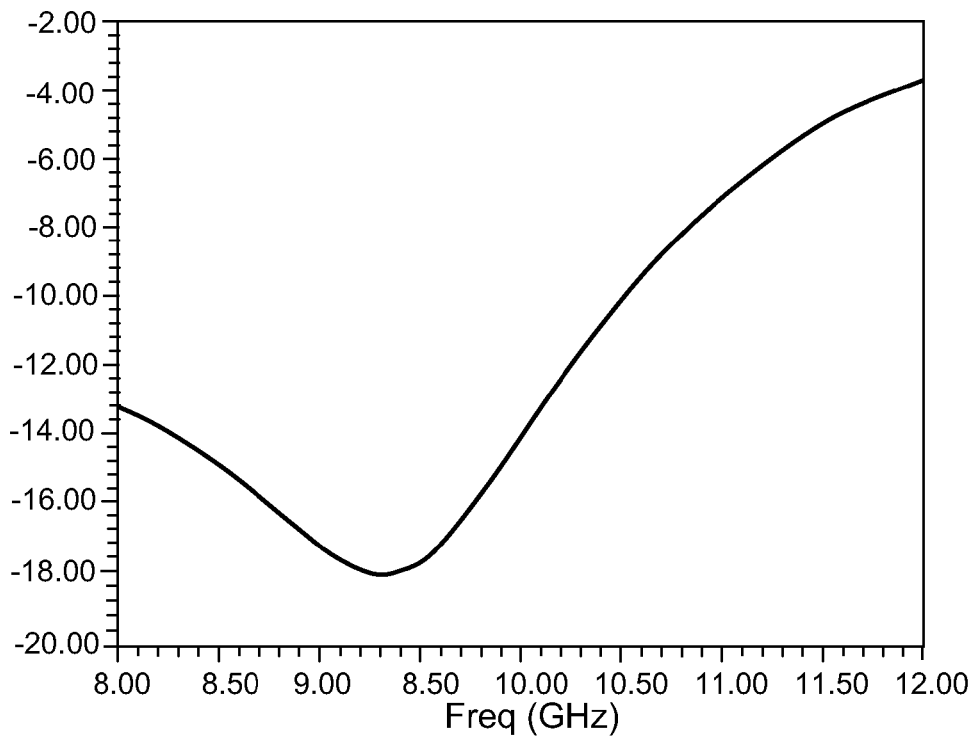
FIG. 5 represents the matching level S11 of the example represented in FIG. 4.
Figure 6:
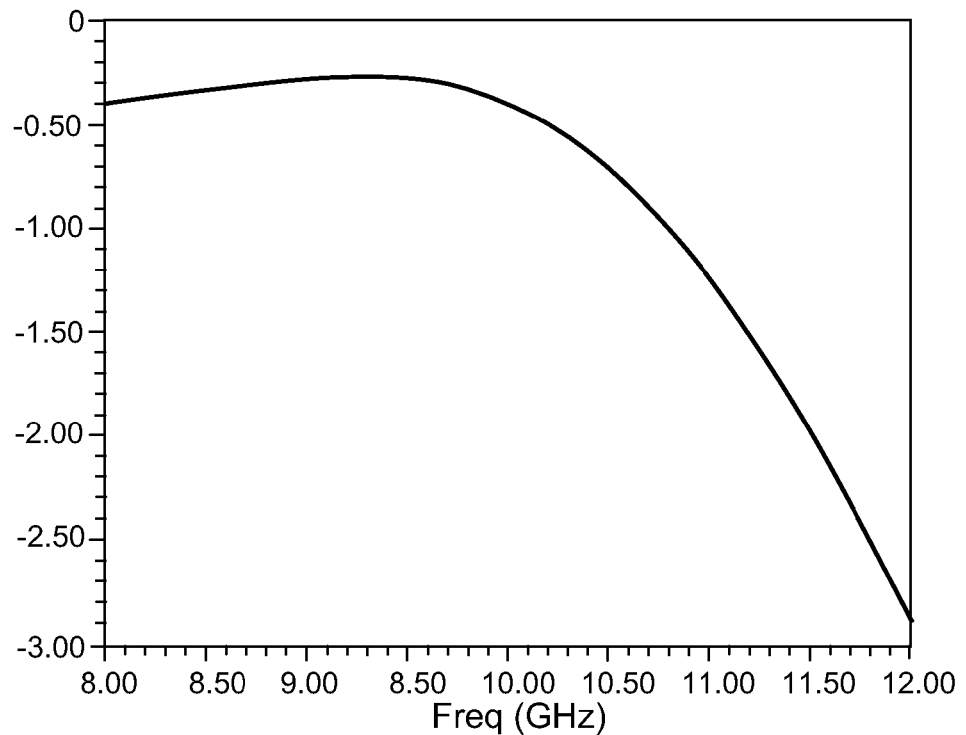
FIG. 6 represents the insertion level S21 or insertion losses of the example represented in FIG. 4.

The impedance of the transition is reduced compared to that obtained in the embodiment of FIG. 1. However, the transparency is not perfect, and it is possible to correct it in the vicinity of the bump contact 15 by including in the transmission line an inductive line section 20 and a capacitive line section 21 in order to produce a low-pass type filtering cell cooperating with the impedance added by the connection between the central core of the connector 11 and the bump contact 15. The identifiers 20 and 21 also appear in FIG. 4. In practice, the inductive 20 and capacitive 21 line sections fulfil the same function. It is, however, important to note that the impedance values added in FIG. 8 by the two line sections 20 and 21 are less than those added in FIG. 4. This makes it possible to obtain a wider-band filtering for the embodiment of FIG. 8. This bandwidth is important to the reproducibility of the transparency of the transition. It has, in practice, been found that, with similar production tolerances for the printed circuit 10 and for the positioning of the connector 11 on the printed circuit 10, the transparency of the transition defined in FIG. 8 evolves within a range that is significantly less than for the transition defined in FIG. 4.

Figure 9:
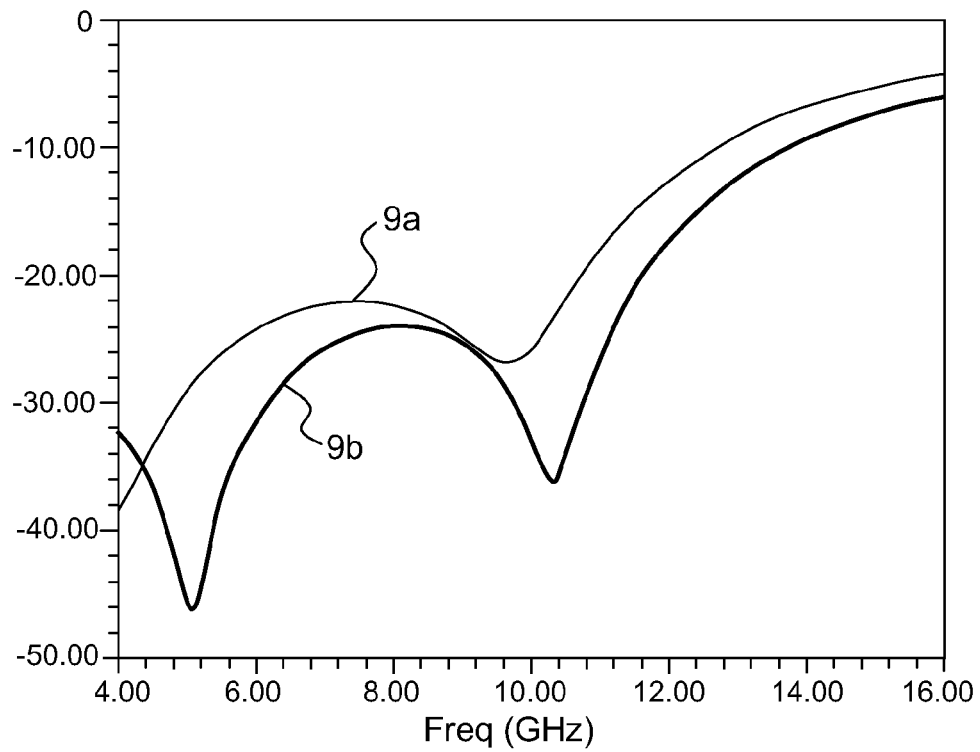
FIG. 9 represents the matching level S11 of the example represented in FIG. 8.
Figure 10:
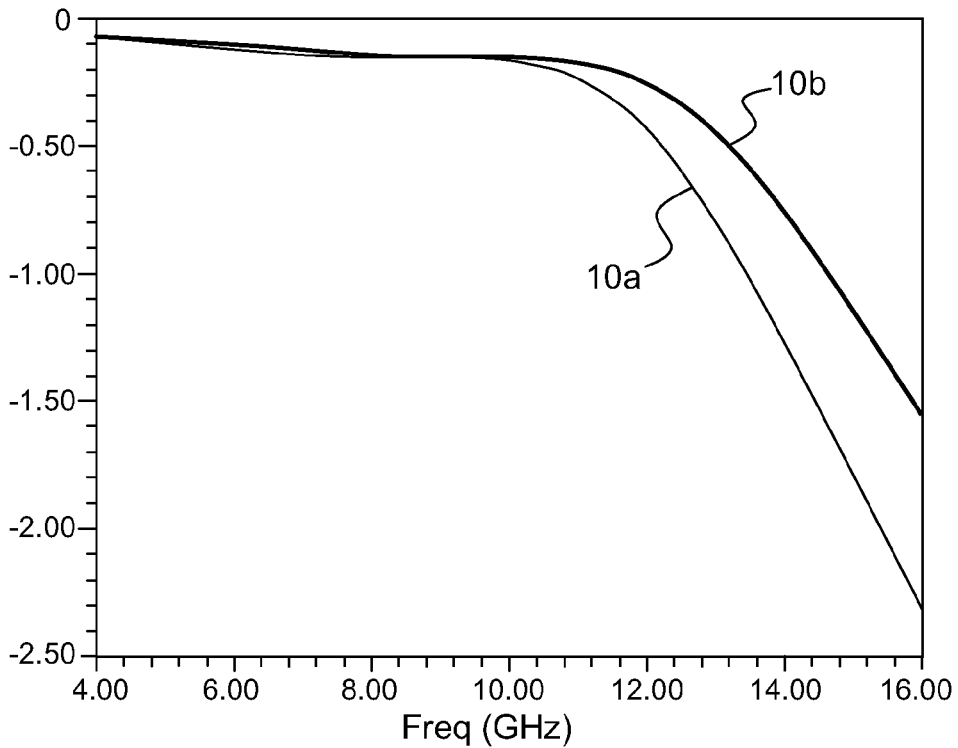
FIG. 10 represents the insertion level S21 or insertion losses of the example represented in FIG. 8.

As an example, FIG. 9 represents the matching level S11 of the example represented in FIG. 8 expressed in dB according to the frequency of the signal conveyed by the transmission line 13 and the connector 11. Still for this example, FIG. 10 represents the insertion losses expressed in dB according to the frequency of the signal. The numerical values proposed for FIGS. 1 to 6 have been used again for the embodiment whose structure is represented in FIGS. 7 and 8. The printed circuit comprises two insulating substrates of relative permittivity $\epsilon_r$ equal to 3.38, the substrate separating the external face 12 from the internal ground plane 25 has a thickness of 203 μm and the substrate separating the internal ground plane 25 from the ground plane 27 has a thickness of 406 μm.

Two exemplary corrections are illustrated in FIGS. 9 and 10 according to the length of the inductive line section 20. In FIG. 9, a curve 9a represents the matching level for a length of the inductive line 20 of 1600 μm and a curve 9b represents the matching level for a length of 1200 μm. For a useful working frequency of 9.3 GHz, the matching level is approximately −26 dB in both correction examples. Similarly, for FIG. 10, a curve 10a represents the insertion losses for a length of 1600 μm and a curve 10b for a length of 1200 μm. Still for a useful working frequency of 9.3 GHz, the insertion losses are 0.15 dB for both correction examples.

The combined implementation of the resist 26 and of a low-pass type correction makes it possible to obtain an excellent level of performance for the transition between the connector 11 and the transmission line 13 over a very significant bandwidth. Obviously, the numerical examples proposed hereinabove should be adapted by tests according to the useful working centre frequency.

Figure 11:
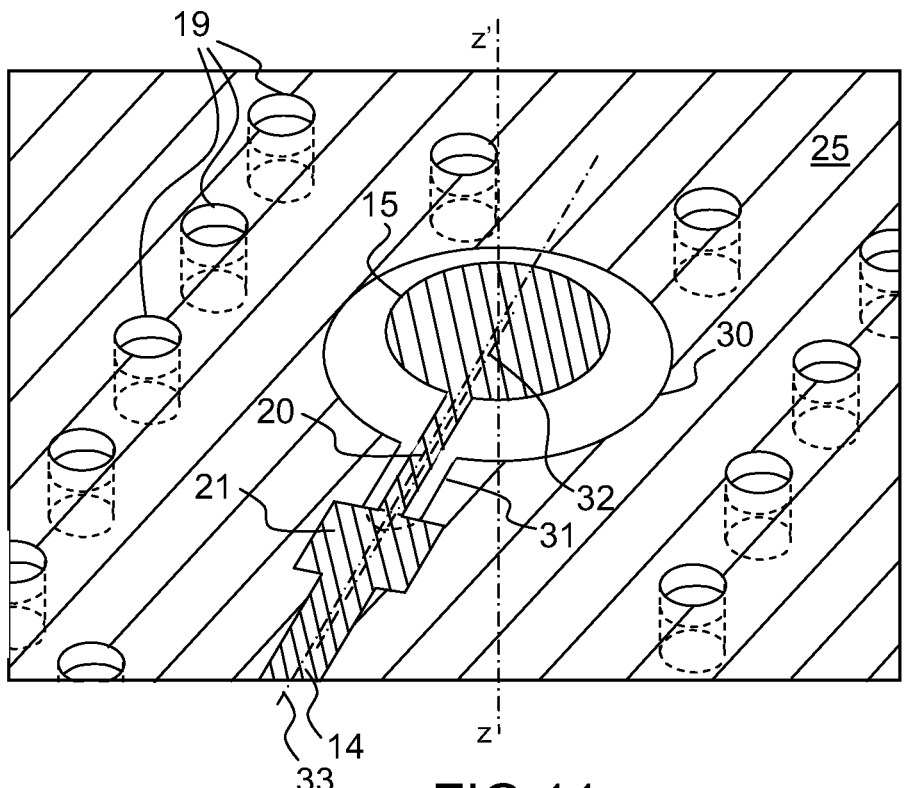
FIG. 11 represents, in perspective, a variant embodiment of a printed circuit according to the invention.

In the correction examples illustrated previously, the width of the inductive line section 20 is 200 μm. This width is smaller than the width of the rectilinear part 14 which is 450 μm in order to obtain an inductive effect. This width reduction also tends to oppose the passage of the signal in the transmission line 13. This drawback can be limited by modifying the shape of the resist 26. The bump contact 15 retains its circular shape centred on the axis zz', the shape being imposed by the choice of the connector 11. A variant shape of resist 26 that makes it possible to limit this drawback is illustrated in FIG. 11. More specifically, the resist 26 comprises a circular part 30 centred on the axis zz' and an elongate part 31 extending along a second axis 32 parallel to a main direction 33 of the rectilinear part 14 of the transmission line 13 in contact with the bump contact 15.

This variant does not exclude implementing a correction using inductive 20 and capacitive 21 line sections. It has, however, been found that not locally having any ground plane under the inductive line section 20 greatly enhances the inductive nature sought for this element. Consequently, with a given inductive line width, the inductive line section 20 will, for example, be shorter than the case of FIG. 8 and therefore of a more localized nature. The elongate part 31 can be extended only facing the inductive line section 20.

Figure 12:
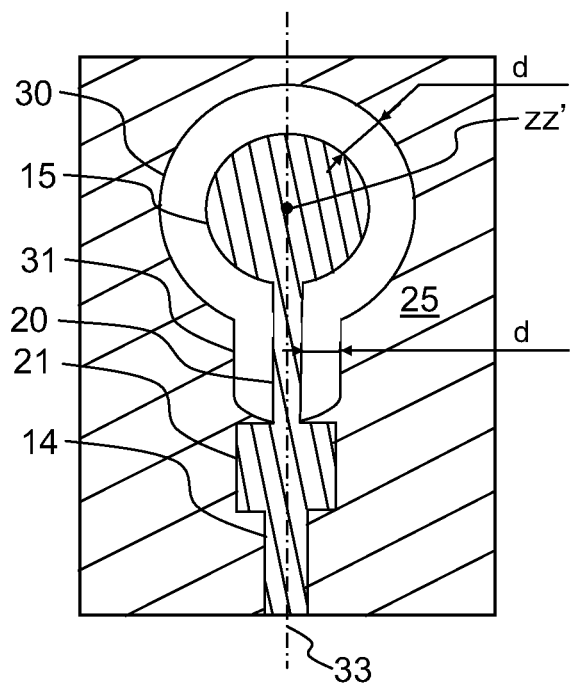
FIG. 12 represents the variant of FIG. 11 seen perpendicularly to the printed circuit.

FIG. 12 represents the variant of FIG. 11 seen perpendicularly to the printed circuit 10. Advantageously, a projection of the transmission line, on the internal ground plane 25, maintains a distance d that is substantially constant relative to the edge of the resist 26, the distance d being measured on the one hand between the bump contact 15 and the circular part 30 of the resist 26 and on the other hand between the rectilinear part 14 of the transmission line 13 and the edge of the resist 26 perpendicularly to the main direction 33 of the rectilinear part 14. If the elongate part 31 extends only facing the inductive line section 20, for this part 31, the distance d is measured between the edge of the resist 26 and the inductive line section 20.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A connection device for high frequency signals, comprising:
   a printed circuit having an external face and a transmission line printed on the external face; and
   a coaxial connector surface mounted on the external face of the printed circuit,
   wherein the transmission line is connected to the connector by means of a bump contact belonging to the transmission line to which is attached a central core of the connector, the printed circuit having at least one internal ground plane disposed parallel to the external face and contributing to the matching of the transmission line, the internal ground plane defining a perforation therethrough that faces the bump contact.

2. The device according to claim 1, wherein the printed circuit further comprises a second ground plane disposed parallel to the internal ground plane, the internal ground plane being situated between the transmission line and the second ground plane, the second ground plane being continuous facing the bump contact.

3. The device according to claim 2, wherein the transmission line further comprises, in the vicinity of the bump contact, a low-pass filtering cell cooperating with the impedance added by the transition between the central core of the connector and the bump contact.

4. The device according to claim 3, wherein the filtering cell further comprises an inductive line section and a capacitive line section.

5. The device according to claim 2, wherein the bump contact is circular and centered on an axis, and
wherein the perforation is circular and centered on the axis.

6. The device according to claim 5, wherein a diameter of the perforation is greater than a diameter of the bump contact so as to limit an impedance generated between the bump contact and the internal ground plane.

7. The device according to claim 2, wherein the bump contact is circular and centered on a first axis, and
wherein the perforation has a circular part centered on the first axis and an elongate part extending along a second axis parallel to a main direction of a rectilinear part of the transmission line in contact with the bump contact.

8. The device according to claim 1, wherein the transmission line further comprises, in the vicinity of the bump contact, a low-pass filtering cell cooperating with an impedance added by the transition between the central core of the connector and the bump contact.

9. The device according to claim 8, wherein the filtering cell comprises an inductive line section and a capacitive line section.

10. The device according to claim 1, wherein the bump contact is circular and centered on an axis, and
wherein the perforation is circular and centered on the axis.

11. The device according to claim 10, wherein a diameter of the perforation is greater than a diameter of the bump contact so as to limit an impedance generated between the bump contact and the internal ground plane.

12. The device according to claim 1, wherein the bump contact is circular and centered on a first axis, and
wherein the perforation has a circular part centered on the first axis and an elongate part extending along a second axis parallel to a main direction of a rectilinear part of the transmission line in contact with the bump contact.

13. The device according to claim 12, wherein a projection of the transmission line onto the internal ground plane maintains a distance relative to the edge of the perforation that is substantially constant,
wherein the distance is measured on the one hand between the bump contact and the circular part of the perforation and on the other hand between the rectilinear part of the transmission line and the edge of the perforation, and
wherein the distance is measured perpendicular to the main direction of the rectilinear part.

\* \* \* \* \*